United States Patent [19]

Flowers et al.

[11] 4,381,213
[45] Apr. 26, 1983

[54] PARTIAL VACUUM BORON DIFFUSION PROCESS

[75] Inventors: Dervin L. Flowers, Scottsdale; Sylvia B. Thompson, Phoenix, both of Ariz.

[73] Assignee: Motorola, Inc., Schaumburg, Ill.

[21] Appl. No.: 216,873

[22] Filed: Dec. 15, 1980

[51] Int. Cl.³ ............................................. C30B 25/02
[52] U.S. Cl. .................................... 156/606; 156/614
[58] Field of Search ............... 156/606, 613, 610, 614, 156/612, DIG. 64, DIG. 73; 148/174, 175; 427/85, 87, 95, 255.3

[56] References Cited

U.S. PATENT DOCUMENTS

| 2,873,222 | 2/1959 | Derick et al. | 427/85 |
|---|---|---|---|
| 3,200,019 | 8/1965 | Scott, Jr. et al. | 427/85 |
| 3,874,920 | 1/1975 | Chappelow et al. | 427/85 |
| 4,263,336 | 4/1981 | Thompson et al. | 427/85 |

FOREIGN PATENT DOCUMENTS

| 2430859 | 1/1975 | Fed. Rep. of Germany | 427/85 |
|---|---|---|---|
| 143542 | 8/1980 | Fed. Rep. of Germany | 427/85 |
| 52-44166 | 4/1977 | Japan | 156/606 |

OTHER PUBLICATIONS

Busen et al., "Ellipsomeric Investigations", published in J. of Electrochem. Soc.: Solid State Science, Mar. 1968, pp. 291–294.
Wakefield et al., "Chemical Vapour Deposition", 4th International Conf. published by Electrochem. Soc., 1973, Lib. of Congress #73-86873.
Runyan, "Silicon Semiconductor Technology", McGraw-Hill Book Co., 1965, pp. 146–148.
Negrini et al., "Boron Predeposition in Silicon", published in J. of Electrochem. Soc.: Solid-State Science and Tech., Apr. 1978, pp. 609–613.

Primary Examiner—Hiram H. Bernstein
Attorney, Agent, or Firm—Robert M. Handy

[57] ABSTRACT

A method is presented for the uniform and reproducible boron doping of many closely spaced silicon wafers in a single batch, wherein a particular process sequence and specified ranges of reactant gas compositions, flow rate and pressure are utilized. The method is illustrated for $BCl_3$ as a boron source gas and $H_2$ and $O_2$ as an oxidant gas. Superior results are obtained when $BCl_3$ and $H_2O$ are present in the reaction chamber at pressures less than 10 Torr (1.3 kPa) and molar ratios are in a specific range close to but not equal to that necessary for stoichiometric production of $B_2O_3$.

15 Claims, 5 Drawing Figures

PARTIAL VACUUM BORON DIFFUSION PROCESS

BACKGROUND OF THE INVENTION

This invention relates to boron doping of semiconductors, and more specifically to the achievement of a high degree of uniformity and reproducibility in the boron doping of many large diameter silicon semiconductor wafers at the same time.

Various dopant impurities are used to alter the electrical properties of silicon so that different device and circuit functions can be achieved. It is essential that the doping process give reproducible and uniform results, that is, reproducible from manufacturing run to manufacturing run, and uniform within a given manufacturing run so that, insofar as possible, each location on the semiconductor wafer and each semiconductor wafer receives substantially the same concentration of dopant and the same penetration depth into the wafer. The element boron has been found to have useful and convenient properties as an impurity dopant in silicon and is much used. Therefore, manufacturing methods which provide boron doping of silicon to a high degree of reproducibility and uniformity are of great technical and practical utility.

A useful technique for impurity doping of silicon is the open-tube system wherein a batch of wafers is inserted into a furnace tube or reaction chamber placed within a high temperature furnace having a temperature near 1000° C. A controlled atmosphere is maintained within the tube. The tube is open in the sense that various gases can be introduced, flow through the tube or reaction chamber, and be extracted. A gaseous species containing boron is either introduced directly into the tube, or generated within the tube by reaction or evaporation of a boron compound. The gas stream may also contain relatively inert carrier gases such as $N_2$, Ar or He, and/or active species such as $O_2$, $H_2$ or $H_2O$, for example, capable of oxidizing or reducing the boron dopant source compound and/or the silicon material within the diffusion tube. Alternatively the inert carrier gas may be omitted and the active gases used without dilution at various pressures. $BCl_3$ is a typical boron source gas and is used to illustrate the reactions which can occur.

Reaction of $BCl_3$ in a reducing atmosphere produces elemental boron as a doping impurity source for the silicon, and HCl which reacts with Si to form $SiCl_4$. The $SiCl_4$ is gaseous at the temperatures of interest, so the reaction also etches the silicon, an effect generally desired to be avoided. In oxidizing atmospheres, $BCl_3$ reacts to produce $B_2O_3$ and $SiO_2$ as reaction products, which deposit or form on the silicon wafers. HCl is also produced and can etch or pit the silicon through formation of $SiCl_4$, but this reaction is less likely than the formation of $SiO_2$, so that the problem is less severe than in reducing atmospheres. Hence, oxidizing ambients have generally been preferred in the prior art, and a large excess of oxidant typically used, for example, ten times or more of the amount needed for stoichiometric productions of $B_2O_3$.

The boron oxide deposited on the silicon surface provides the primary source of boron dopant atoms rather than the gas stream itself. This permits the doping process to be divided into two sequential steps which, for reasons of control, are carried out at slightly different temperatures; (a) "deposition" typically carried out in the range 700°–900° C. in which a $B_2O_3+SiO_2$ mixture is formed on the silicon wafers; and (b) "drive" in which the boron source gas is removed and the silicon wafers raised to a higher temperature (typically 900°–1100° C.) in order to accelerate solid-solid diffusion of the boron from a $B_2O_3/SiO_2$ glassy layer into the silicon semiconductor body. The deposition step provides primary control of the surface impurity concentration, and the drive step provides primary control of the depth to which diffusion is achieved. The above-described reactions are well known per se in the art.

In the open tube method, the boron source gas and other reactant gases (hereinafter the composite gas) pass continuously through the tube. As the composite gas stream passes over the silicon wafers and the deposition-oxidization reactions occur, there is depletion of the active species from within the gas stream. The thickness of the dopant source oxide formed on the first wafers (nearer the gas source end) may be many times that formed on the last wafers in the batch, nearer the exhaust or pump end. There will also be depletion of the reactants from the periphery to the center of the wafers. These depletion effects give rise to non-uniformity in the formation of the boron dopant source oxide layer and consequently on the resultant impurity concentration and distribution within the silicon.

The smaller the spacing between wafers and the larger the diameter, the more severe the depletion. Thus in the prior art, wafers could not be closely spaced within the reaction chamber in order to process large numbers in a single run without suffering significant depletion and non-uniform deposition effects. Conversely, if greater uniformity was desired, larger wafer spacings were mandatory, and production efficiency suffered. As wafer diameter has increased from two inches (5.1 cm) to four inches (10.2 cm) or larger, these spacing and uniformity problems have become especially troublesome.

It is also known that $B_2O_3$ can dissociate in the presence of silicon at high temperatures (>800° C.) to form what is believed to be an intermetallic boron-silicon compound $SiB_X$ that is soluble only in solvents which attack silicon. The $SiB_X$ can be advantageously used to enhance doping uniformity, but its undesirable etch properties must be avoided in some way so that subsequent process steps may be accomplished without etching the silicon.

In the prior art, a variety of approaches have been utilized to achieve uniform doping by the minimization of the reactant depletion effects. For example, (a) use of high composite gas flow rate (e.g. 0.1–10 liters per minute), (b) use of large wafer spacing (e.g. 0.5–10 cm), which limits the number of wafers that can be treated in a single batch, and (c) use of low pressures (e.g. <1 Torr, 0.13 kPa) so as to increase the mean free path of gas molecules within the reaction chamber and enhance surface reaction. However, none of these approaches has proved entirely satisfactory. A need continues to exist for a process capable of producing uniform and reproducible boron doping of silicon which is both economical with respect to gas usage, able to handle batches of a hundred or more silicon wafers of four inch (10.2 cm) diameter or larger in a single uninterrupted diffusion run, and which is also compatible with other desired process steps.

Boron is a p-type impurity in silicon and, when diffused into an n-type silicon body, forms a p-n junction.

In this circumstance, a convenient method of evaluating the results of the diffusion operation is to measure the sheet resistance $R_s$ in ohms per square and the junction depth $X_j$ in microns. The methods for performing these measurements are well known per se in the art.

In view of the foregoing, it is an object of this invention to provide an improved method for uniform and reproducible boron doping of silicon.

It is a further object of this invention to provide an improved method for uniform and reproducible boron doping of silicon at low pressure.

Another object of this invention is to provide for uniform and reproducible boron doping of silicon with smaller reactant gas consumption.

Another object of this invention is to provide an improved method for uniform and reproducible boron doping of silicon while preventing undesirable etching of the silicon surface.

Another object of this invention is to provide an improved method for controlled oxidization and boron doping of silicon.

Another object of this invention is to provide an improved method for the formation and subsequent removal of a boron-silicon intermediate layer at the surface of the silicon semiconductor as an aid to obtaining improved uniformity and reproducibility of boron doping in silicon without disruption of subsequent process steps.

A further object of this invention is to provide a method for uniform and reproducible boron doping of large diameter silicon wafers which are closely spaced in the reaction chamber so that relatively large numbers can be processed simultaneously in a single batch to reduce manufacturing costs.

SUMMARY OF THE INVENTION

The attainment of the foregoing and other objects and advantages is achieved through the present invention, wherein the reactant gases are constrained to have concentration ratios within a specified range at a given boron source gas flow rate or total system pressure, the concentration ratio being close to but not equal to the stoichiometric ratio for the production of boron oxide. A predetermined sequence of events is followed so that pitting or etching of the silicon surface is avoided despite the production of etchant species during the reaction. The formation of a boron-silicon intermetallic compound is promoted prior to the drive step and reoxidized prior to completion of the process, wherein the boron source layer formed on the silicon has thickness at least sufficient to act as a non-depleting diffusion source. This combination of process steps minimizes the dopant source thickness variations and further minimizes the effect of those remaining thickness variations on the resultant resistivity obtained even though relatively close spacing and many large diameter silicon wafers are processed in the reaction chamber at the same time.

DETAILED DESCRIPTION OF PREFERRED EMBODIMENT

Figure 1:
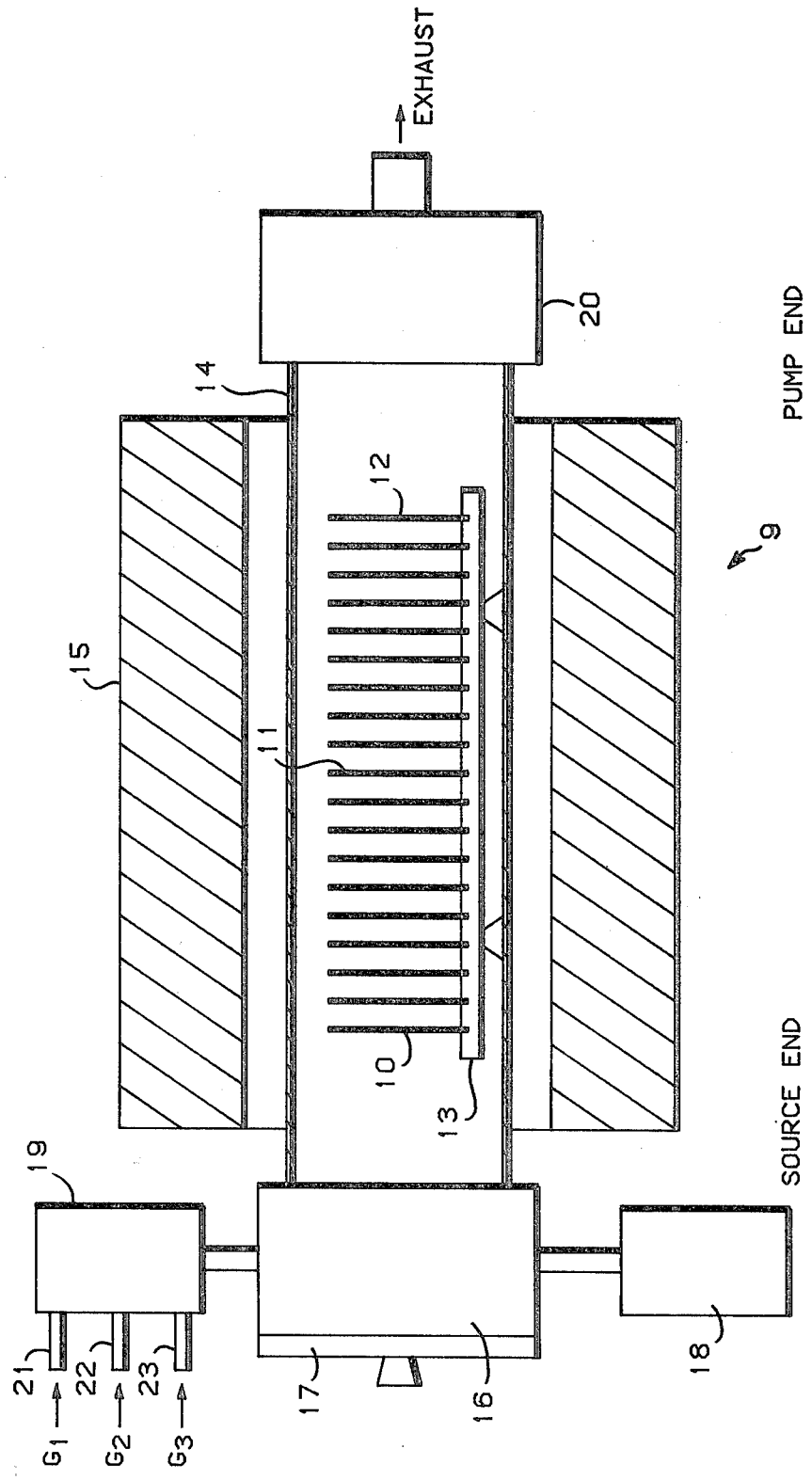
FIG. 1 shows in schematic form apparatus suitable for the practice of the invented method.

An apparatus 9 shown schematically in FIG. 1 is typically used in the practice of this invention, wherein silicon wafers 10–12 having been installed in wafer holder 13 and are placed in reaction tube 14 located within heating means 15. Reaction tube 14 is closed in a substantially gastight manner by end cap 20 which is connected to an exhaust pump, and end cap 16 containing vacuum type access door 17 and pressure sensor 18 and mass flow control 19 to which in turn are connected several sources 21–23 of high purity gases $G_1$–$G_3$.

The following is an example of the practice of a preferred embodiment of the method of this invention, utilizing the apparatus illustrated in FIG. 1.

1. PREPARATION AND INITIAL OXIDIZATION

Silicon wafers to be processed are cleaned, loaded into a wafer holder and inserted in the reaction zone of a high temperature (e.g. 800° C.) furnace in a dry protective atmosphere by methods well known per se in the art. Fifty to one hundred four inch (10.2 cm) wafers with wafer to wafer spacing of 1–5 mm, typically 3 mm, are typically used. One or more dummy (scrap) wafers may be placed at each end of the load. The reaction chamber is evacuated to a pressure of less than 10 Torr (1.3 kPa), preferably less than 1 Torr (0.13 kPa), and in most cases typically in the range 0.05–0.15 Torr (0.67–20 Pa).

Hydrogen and oxygen are admitted to grow an initial oxide film of thickness $D_o$ less than 100 Angstrom units, typically less than 50 Angstrom units. This oxide forms a protective layer which seals the silicon surface to prevent subsequent pitting or etch damage during subsequent stages of the process. While this procedure is convenient other methods well known per se in the art may be used.

2. DEPOSITION $BCl_3$, $H_2$ and $O_2$ are admitted to the reaction chamber at flow rates adjusted to maintain total pressure below 1 Torr (0.13 kPa), to give a desired $SiO_2/B_2O_3$ deposition rate, and to give a desired mole fraction $\Delta$ (hereinafter defined) of oxidant gas to boron. Typical conditions are; $BCl_3$ flow of 3–15 cc/minute, total pressure of 0.05–0.5 Torr (6.7–66.5 Pa), deposition time 30 minutes and mole fraction $\Delta$ between $-3$ and $+6$ but not equal to zero. After the desired boron source layer thickness $D_s$ is achieved, gas supplies are shut off and the chamber evacuated.

3. HEAT CYCLE

The wafers are allowed to "soak" in the evacuated reaction chamber at, typically 800° C. for a predetermined time, typically 15 minutes, to promote the formation of $SiB_x$. They are then heated to the "drive" temperature, typically 900° C., in an inert ambient where they remain for a time necessary to achieve the desired junction depth, typically 30 minutes in these experiments. The temperature is then reduced to 700-800° C. typically, and $H_2$ and $O_2$ admitted for typically 30 minutes to re-oxidize the $SiB_x$ formed earlier. The re-oxidation step is necessary to convert the $SiB_x$ back to an oxide so that it can be readily removed without having to etch the silicon. This avoids interference with subsequent processing steps. The reoxidation may be performed in the same or a different furnace.

An alternative heat cycle is to omit the soak step and proceed directly to the drive step, in which case the re-oxidation step may be shortened or eliminated. However, it is expected that doping uniformly will be degraded.

The times and temperatures given in the above exemplary method are illustrative of convenient values. Other combinations of temperature and time may be selected by methods well known per se in the art to give equivalent results. Further, in the examples presented, the soak step is conveniently carried out in vacuum. Any non-oxidizing ambient will give equivalent results.

It was discovered that the thickness and uniformity of the boron source layer depended critically upon the relative proportions of the boron source gas and the oxidant gas, which in most cases was $H_2O$ or its equivalent in the form of independently injected hydrogen and oxygen. Mole fractions $\Delta$ and $\gamma$ are defined by the following equation as a measure of the amount (in moles) by which the water vapor oxidant, or the excess oxygen, respectively, differ from the stoichiometric ratio necessary to produce $B_2O_3$ in the presence of silicon.

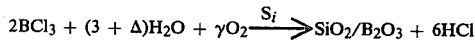

$$2BCl_3 + (3 + \Delta)H_2O + \gamma O_2 \xrightarrow{S_i} SiO_2/B_2O_3 + 6HCl$$

It was discovered that with both $\Delta$ and $\gamma$ equal zero; that is, only sufficient oxidant for the stoichiometric reaction of $BCl_3$ to form $B_2O_3$, that little or no boron source layer or significant additional $SiO_2$ film was formed on the wafers, during the run times of interest (typically 30 minutes), and pressures and flow rates used. As excess oxidant over the stoichiometric ratio was supplied, that is $\Delta$ greater than 0 or $\gamma$ greater than 0 or both, then film formation occurred but with uniformity along the wafer load significantly dependent upon the amount of excess oxidant. Film formation also occurred as the composite gas mixture was made rich in $BCl_3$ compared to the stoichiometric ratio, e.g. $\Delta$ less than zero but greater than $-3$, and $\gamma$ equal to zero. (For $\Delta$ equals $-3$ and $\gamma$ equals 0, no oxidant is present and no $B_2O_3$ is expected.) At high flow rates and pressures some film formation occurred at stoichiometry ($\Delta = \gamma = 0$), but uniformity was poorer.

Figure 2:
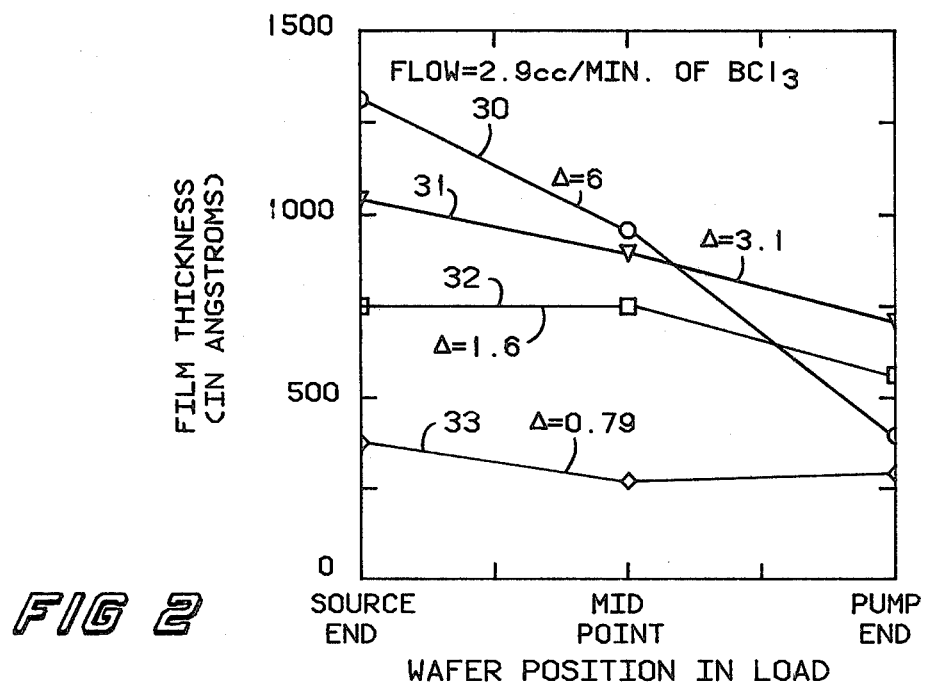
FIG. 2 shows experimental results for dopant source layer film thickness formed according to the method of this invention on different silicon wafers as a function of their position within the wafer load batch, for different values of the ratio of reactants at constant $BCl_3$ input rate.

FIG. 2 shows the film thickness formed on the silicon wafers measured in Angstroms ($10^{-10}$m) as a function of wafer position along the wafer holder for different amounts of excess oxidant; lines 30-33 of FIG. 2 corresponding to values of $\Delta = 6$, 3.1, 1.6, and 0.79 respectively. It can be seen that more uniform deposition is obtained at small values of excess mole fraction $\Delta$, for $\Delta$ greater than zero.

Figure 3:
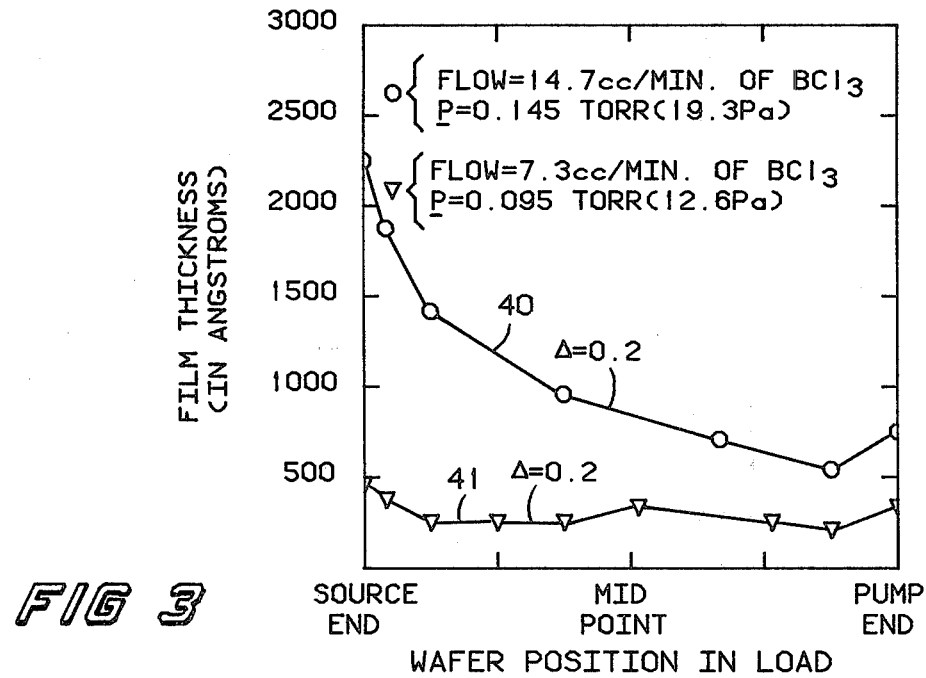
FIG. 3 shows the dopant source layer film thickness as a function of wafer position within the wafer load batch for different boron source gas flow rates and different total system pressure.

FIG. 3 shows the effects of varying the flow rate and pressure of reactants on the uniformity. In practice, flow rate was adjusted and resulting total system pressure P measured at gauge 18 of FIG. 1. Since the system is being continuously evacuated by the pump, reducing the gas input flow rate also results in a drop in system pressure. Flow meters were calibrated to read in cubic centimeters per minute of gas at atmospheric pressure and room temperature (approx. 20° C.). Line 40 corresponds to a flow rate of 14.7 cc per minute of $BCl_3$ and $P=0.145$ Torr (19.2 Pa), and line 41 corresponds to 7.3 cc per minute and $P=0.095$ Torr (12.6 Pa). In both cases the hydrogen and oxygen flow rates were adjusted to be in the molar ratio 2:1 and of magnitude necessary to give $\Delta=0.2$ mole excess $H_2O$. An additional run carried out at a flow rate of 4.8 cc per minute of $BCl_3$, and $P=0.075$ Torr (10 Pa), and otherwise identical conditions, produced no measurable film.

Figure 4:
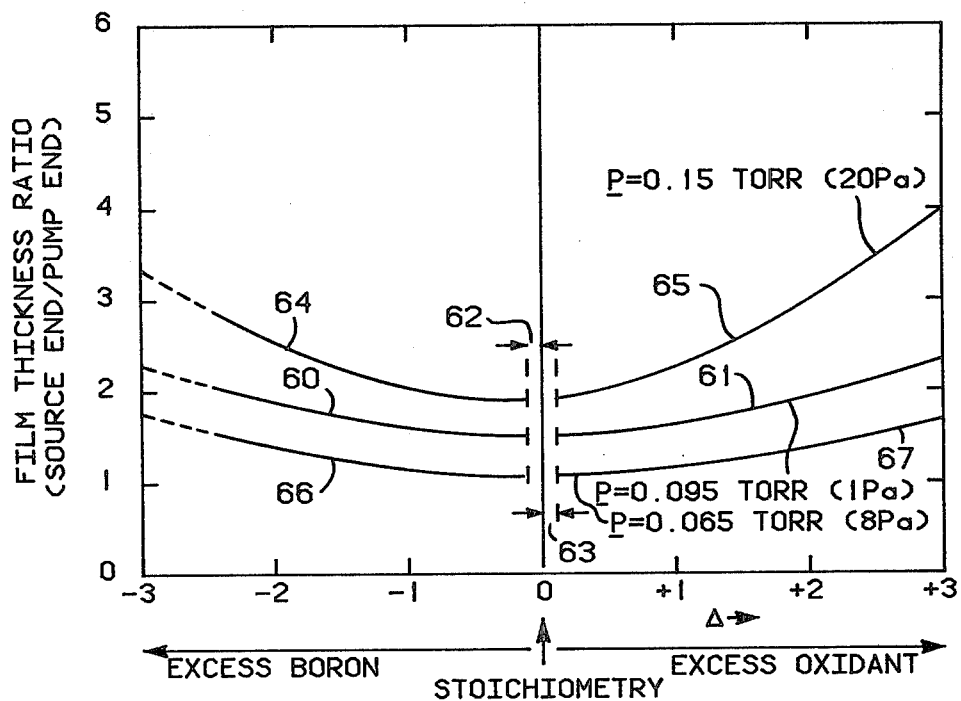
FIG. 4 shows the dopant source layer film thickness ratio as a function of the departure of the boron source gas and oxidant gas from $B_2O_3$ stoichiometry.

Based on these and other experiments, a more generalized relationship was discovered between the uniformity of the boron source layer deposited in this manner and the departure of the reactant mixture from the ratios necessary for the stoichiometric production of $B_2O_3$. These relationships are illustrated in FIG. 4 which presents the film thickness ratio; that is, the ratio of film thicknesses measured on wafers taken respectively from the source and pump end of the wafer holder (see FIG. 1) versus the amount by which the reactant ratios differ from $B_2O_3$ stoichiometry, for three different total system pressures. It was found that the film thickness ratio improved (decreased) as $\Delta$ approached zero, i.e. stoichiometry (FIG. 4, lines 60-61). However, for values of $\Delta$ close to zero, that is approximately in the range $-0.03$ to $+0.06$ (FIG. 4, regions 62-63), little or no film was obtained for most of the times, temperatures, flow rates, and pressures utilized. This is an unanticipated result. For values of $\Delta$ on either side of the "anomolous deposition" zone 62-63, the film thickness ratio was found to be a slowly varying function of the $BCl_3$ (or $H_2O$) concentration, particularly for negative values of $\Delta$. This slowly varying relationship is a desirable result. No pitting or etching of the Si was observed even though the atmosphere is non-oxidizing for $\Delta$ less than zero.

Curve 60 shown in FIG. 4 represents conditions for approximately constant oxidant flow rate and curve 61 for approximately constant boron source flow rate. Utilizing different flow rates or reaction chamber pressures produces a family of curves 64-65 and 66-67, displaced approximately vertically up and down from curve 60-61, up corresponding to higher flow rates and pressures and down to lower flow rates and pressures, other things being substantially equal.

Operation at total system pressures P below 10 Torr (1.3 kPa), preferably below 1 Torr (0.13 Pa), is an important aspect of this process in that low pressures contribute to boron source deposition uniformity by increasing the mean free path of constituent atoms or molecules, and by reducing deposition rates. The flow rate is also reduced so that smaller quantities of reactant gas are consumed, a desirable economy. Note however, that low pressure operation is insufficient by itself to achieve the desired results since thed proper range of $\Delta$ must also be selected.

The resistivity variations are best described by means of three coefficients of uniformity $C_w$, $C_l$, $C_r$, all defined by the same general equation as follows:

$$C = (2\sigma/\bar{R}_s) \times 100 \qquad \text{(percent)}$$

where $\sigma =$ standard deviation of sheet resistance, $\overline{R}_s$ = average value of sheet resistance measured in ohms per square, and where C corresponds to one of three experimentally determined values expressing the uniformity within a wafer ($C_w$), from wafer to wafer in a load or batch ($C_l$) or from run to run ($C_r$), corresponding to the locations where $\sigma$ and $R_S$ are measured.

Figure 5:
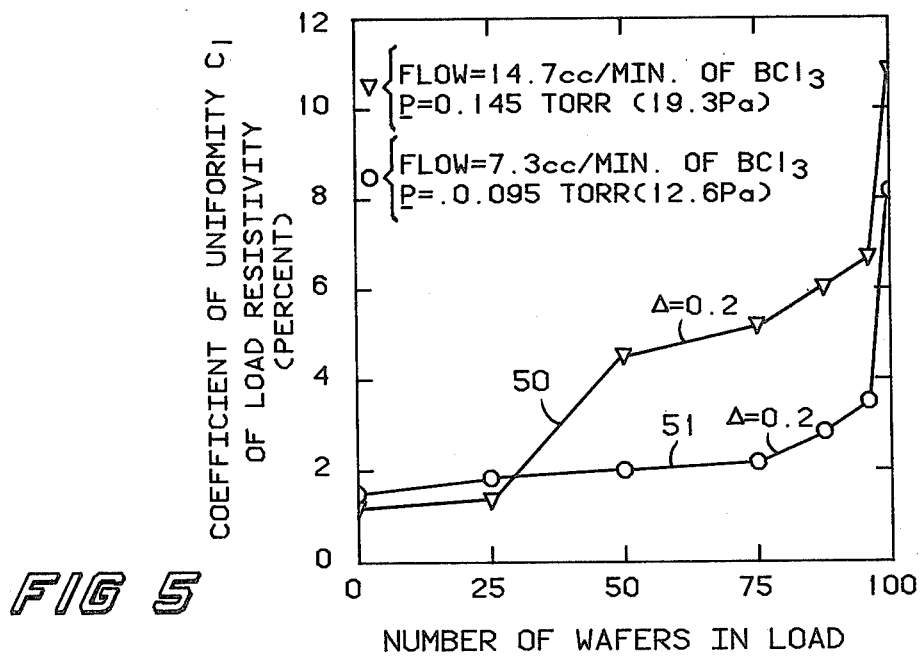
FIG. 5 shows the coefficient of uniformity of resistivity from wafer to wafer within a wafer load batch as a function of the numbers of wafers in centrally selected groups from a 100 wafer load and for several values of boron source gas flow rates and total system pressure.

FIG. 5 shows the coefficient of uniformity $C_l$ from wafer to wafer in a load as a function of variously sized *center groups* of wafers from the load, for two different pressures and flow rates (P=0.145 Torr/19.3 Pa and 14.7 cc per minute of $BCl_3$, line 50; P=0.095 Torr/12.6 Pa and 7.3 cc per minute of $BCl_3$, line 51), both carried out at Δ equal to 0.2. In these runs, the coefficient of uniformity within a wafer $C_w$ was found to be better than 1.8%. Comparing this value with line 51, FIG. 5, one can see that for the central 50 wafers or less of the 100 wafer batch that $C_l$ and was also approximately 1.8%, identical to $C_w$ which is a desirable result.

Approximately 90% of the 100 wafer load has $C_l$ less than 3% and 98% less than 4% (line 51, FIG. 5). No dummy wafers were used in this test, thus when the first and last wafer are included in the measured sample (i.e. abscissa point 100), the value of $C_l$ jumps from 4 to 8%. The first and last wafers of a batch normally show greater non-uniformity of doping than all others in the batch, independent of batch size, because they have the greatest perturbing effect on gas flow. These wafers may be replaced by dummy wafers, or additional dummy wafers may be added to the load. Thus, by utilizing an appropriate number of dummy wafers, coefficients of uniformity better than 3% can be expected across an entire load of 100 or more four inch (10.2 cm) wafers. Higher flow rates and pressures (line 50 in FIG. 5) degrade the uniformity of resistivity along the load.

In other tests, batches of 150 two inch (5.1 cm) wafers have been processed using 4 inch (10.2 cm) dummy wafers and $C_l$ less than 2% obtained for all 150 wafers. Use of dummy wafers having a diameter larger than the wafers of the production batch was found to improve uniformity along the batch.

Run-to-run uniformity $C_r$ was determined from a series of seven runs with fifty 3 inch (7.6 cm) wafers per run in which deposition, soak, drive and reoxidation temperatures and times were respectively: 920° C., 30 minutes; 920° C., 20 minutes; 955° C., 30 minutes; and 700° C., 30 minutes, and Δ=0.2 was used. For these runs, wafer uniformity $C_w$ was 1.3%, load uniformity $C_l$ was 2.6%, and run-to-run uniformity $C_r$ was 2.3%. Thus, the repeatability (measured by $C_r$) was comparable to the uniformity (measured by $C_w$ and $C_l$). These results compare favorably to prior art values reported in the technical literature for $C_w$ of 1–4%, $C_l$ of 3–10% and $C_r$ of 4–20 % most of which were obtained using relatively small numbers of wafers per batch (less than 10 to 40), relatively small diameters (1.5–3 inches, 3.8–7.6 cm), a variety of doping techniques such as boron nitride source wafers, spin-on doped glasses and various gas sources, and a variety of wafer to wafer spacings, mostly unspecified. Prior art method tests in the inventors' laboratory on loads of fifty 3 inch (7.6 cm) diameter wafers at 5 mm spacing gave values for $C_w$ of 2.0–3.3%, $C_l$ of 4.2–6.4% and $C_r$ of 8.4%. When the same methods were applied to four inch wafers much poorer values were obtained. Thus, the results obtained using the invented method are better and apply to larger numbers of larger wafers, these achievements being significant improvements over the prior art.

The following general rule has been formulated for choosing the optimum flow rate and pressure of reactants, which is; utilize the minimum overall flow and pressure of reactants (boron source gas plus oxidants) to give just sufficient boron doped film (boron source layer) to act as a non-depleting diffusion source. Optimum values of flow rate and pressure can be determined by experiment for any given reaction chamber geometry, pump capacity, wafer load configuration, source gas formulation, oxidant formulation and temperature. Application of this rule leads to the most uniform source layer film thickness across the wafer load and correspondingly the lowest coefficient of uniformity of load resistance. It has been calculated that the minimum boron source layer film thickness to act as a non-depleting diffusion source must be of the order of a few hundred Angstroms ($10^{-10}$ m), e.g. less than 500 Angstroms ($5 \times 10^{31\ 8}$ m) equivalent of $B_2O_3$, which corresponds to a few tens of Angstroms ($10^-$ m) of $SiB_x$ during the diffusion drive step. At the same time, the reactant ratios must be adjusted to operate in the regions of favorable film thickness ratio defined in FIG. 4.

For the conditions utilized, it is estimated that only between 10 and 20 percent of the boron potentially available in the reactor reaches the wafers. Some will react on the chamber walls and the rest is exhausted with the waste gases in various forms. More silicon can be placed in the reaction chamber without substantially increasing the depletion effects provided the reactant concentrations are maintained in the appropriate range as determined from the flow rates, temperatures, and system pressures illustrated herein. Thus, the process is amenable to being scaled to wafer loads in excess of 100 wafers and diameters larger than four inches (10.2 cm) and is limited fundamentally, it is believed, only by the length or volume of the uniform temperature reaction zone obtainable with the given furnace.

Thus it is apparent that there has been provided in accordance with the invention, means for uniform and reproducible boron doping of silicon, which may be accomplished at low pressure, which may be accomplished with smaller source and reactant gas consumption, which may be accomplished while preventing undesirable etching of the silicon surface, which provides for controlled oxidation of the silicon, and which provides for the formation, utilization, and subsequent removal of boron-silicon intermediate layers as an aid in obtaining improved uniformity and reproducibility of doping without disruption of subsequent process steps.

While the invention has been described in terms of $BCl_3$ as a boron source gas and hydrogen and oxygen mixtures as oxidants, and various exemplary procedures and apparatus, it will be obvious to those skilled in the art that the inventive method is useful with other boron source compounds and oxidants and with other reactor geometries, heating methods, structures, and procedures which may differ in detail but preserve the central relationships among process materials and steps. Accordingly, it is intended to encompass all such variations as fall within the scope of the invention.

We claim:

1. A method for substantially uniformly and reproducibly boron doping a silicon body within a reaction chamber comprising the steps of:

forming a protective layer on said silicon body to resist etching by gases present in said reaction chamber during subsequent steps;

introducing a composite gas mixture which comprises a boron containing gas and a first oxidant gas of proportions differing from stoichiometric proportions for production of substantially pure boron oxide by a predetermined mole fraction $\Delta$ in the range $-3$ to $-0.03$ or $0.06$ to $6$;

forming a boron source layer on said silicon body by reacting said composite gas mixture in the presence of said silicon body;

maintaining throughout the two preceeding steps a total gas pressure around said silicon body of less than 10 Torr (1.3 kPa);

heating thereafter said silicon body and boron source layer in a controlled atmosphere to achieve a specified redistribution of boron and its incorporation within said silicon body to a desired depth.

2. A method for substantially uniformly and reproducibly boron doping a silicon body made up of at least two silicon wafers in a wafer holder in a reaction chamber by formation on said silicon wafers of a boron source layer formed by reacting a composite gas mixture in the presence of said silicon wafers, comprising the steps of:

arranging said silicon wafers in said wafer holder in at least one group wherein major faces of adjacent wafers are separated by at least one millimeter;

forming a protective layer on said silicon body to resist etching by gases present in said reaction chamber during subsequent steps;

regulating proportions of said composite gas mixture which comprises a boron source gas and a first oxidant gas so that said composite gas mixture differs from stoichiometric proportions for production of substantially pure boron oxide by a predetermined mole fraction $\Delta$ in the range $-3$ to $-0.03$ or $0.06$ to $6$, so as to form said boron source layer;

maintaining throughout the preceeding step a total gas pressure around said silicon body of less than 10 Torr (1.3 kPa);

heating thereafter said silicon wafers in a controlled atmosphere to achieve specified redistribution of boron and its incorporation within said silicon wafers to a desired depth.

3. The method of claim 1 or 2 wherein said protective layer consists essentially of a silicon dioxide layer.

4. The method of claim 3 wherein said silicon dioxide layer has a thickness less than 100 Angstroms ($10^{-8}$ m).

5. The method of claim 1 or 2 wherein said boron source layer has a thickness sufficient to act as a non-depleting source for boron doping.

6. The methods of claim 1 or 2 wherein said boron source layer has a thickness less than 500 Angstroms ($5 \times 10^{-8}$ m).

7. The method of claim 1 or 2 wherein said controlled atmosphere is substantially non-oxidizing.

8. The method of claim 1 or 2 wherein said heating step consists at least of a drive period at a temperature greater than that used for forming said boron source layer.

9. The method of claim 1 or 2 wherein said heating step consists of a soak period wherein said silicon body and boron source layer are heated in a non-oxidizing ambient so as to promote formation of a boron-silicon compound in intimate contact with said silicon body, followed by a drive period in an inert ambient during which boron is incorporated in said silicon body to a desired depth, followed by exposure to a second oxidant gas to re-oxidize remaining boron-silicon compound.

10. The method of claim 1 or 2 wherein said first oxidant gas contains hydrogen and oxygen.

11. The method of claim 1 or 2 wherein said first oxidant gas contains hydrogen and oxygen in a molar ratio of 2-hydrogen to 1-oxygen.

12. The method of claim 9 wherein said second oxidant gas contains hydrogen and oxygen.

13. The method of claim 1 or 2 wherein for said composite gas mixture, a pressure and a flow rate are selected within said reaction chamber such that a minimum deposition rate of said boron source layer is obtained so as to give, within the time available, a boron source layer thickness at least sufficient to act as a non-depleting boron diffusion source.

14. The method of claim 13 wherein said pressure of said composite gas mixture within said reaction chamber is less than 1 Torr (0.13 kPa).

15. The method of claim 2 wherein said silicon wafers are arranged in said wafer holder with one or more dummy wafers of diameter larger than diameter of said silicon wafers, said dummy wafer being placed between said silicon wafers and an inlet for said composite gas mixture.

* * * * *